United States Patent
Usami et al.

(10) Patent No.: US 7,391,115 B2
(45) Date of Patent: Jun. 24, 2008

(54) SEMICONDUCTOR DEVICE AND MANUFACTURING METHOD THEREOF

(75) Inventors: Tatsuya Usami, Kawasaki (JP); Noboru Morita, Kawasaki (JP); Koichi Ohto, Kawasaki (JP); Kazuhiko Endo, Minato-ku (JP)

(73) Assignees: NEC Electronics Corporation, Kanagawa (JP); NEC Corporation, Tokyo (JP)

( * ) Notice: Subject to any disclaimer, the term of this patent is extended or adjusted under 35 U.S.C. 154(b) by 0 days.

(21) Appl. No.: 10/768,676

(22) Filed: Feb. 2, 2004

(65) Prior Publication Data
US 2004/0155342 A1    Aug. 12, 2004

(30) Foreign Application Priority Data
Feb. 4, 2003    (JP) ............................. 2003-026783

(51) Int. Cl.
  *H01L 23/48* (2006.01)
  *H01L 23/52* (2006.01)
  *H01L 29/40* (2006.01)
(52) U.S. Cl. .................. 257/760; 257/758; 257/774; 257/E23.145
(58) Field of Classification Search ................. 257/753, 257/760, 758, 774, E23.145
See application file for complete search history.

(56) References Cited

U.S. PATENT DOCUMENTS

| | | | |
|---|---|---|---|
| 6,227,151 B1 * | 5/2001 | Ma | .................. 123/3 |
| 6,417,092 B1 | 7/2002 | Jain et al. | |
| 6,436,824 B1 | 8/2002 | Chooi et al. | |
| 6,444,568 B1 | 9/2002 | Sundararajan et al. | |

(Continued)

FOREIGN PATENT DOCUMENTS

JP    2002-009150 A    1/2002

(Continued)

OTHER PUBLICATIONS

Chiang et al., "TDDB Reliability Improvements in Cu Damascene by using a Bilayer-Structured PECVD SiC Dielectric Barrier", IEEE International Interconnect Technology Conference (IITC) 2002, pp. 1-3.

*Primary Examiner*—Nitin Parekh
(74) *Attorney, Agent, or Firm*—Sughrue Mion, PLLC

(57) ABSTRACT

An object of the present invention is to provide a semiconductor device which comprises a barrier film having a high etching selection ratio of the interlayer insulating film thereto, a good preventive function against the Cu diffusion, a low dielectric constant and excellent adhesiveness to the Cu interconnection and a manufacturing method thereof.

The barrier film (for instance, a second barrier film 6) disposed between the interconnection or the via plug and its overlying interlayer insulating film is made to have a layered structure made of a plurality of films containing silicon and carbon (preferably, silicon, carbon and nitrogen), with different carbon contents, and, in particular, a low-carbon-concentration film 6a with a small carbon content is set to be a lower layer therein and a high-carbon-concentration film 6b with a large carbon content is set to be an upper layer therein, whereby the effectual prevention against the Cu diffusion, a high etching selection ratio and good adhesiveness to the Cu interconnection can be certainly provided by the presence of the low-carbon-concentration film 6a, while the overall dielectric constant can be well reduced by the presence of the high-carbon-concentration film 6b.

4 Claims, 11 Drawing Sheets

U.S. PATENT DOCUMENTS

| | | | |
|---|---|---|---|
| 6,768,200 B2 * | 7/2004 | Grill et al. | 257/758 |
| 6,784,485 B1 * | 8/2004 | Cohen et al. | 257/325 |
| 6,914,320 B2 * | 7/2005 | Chen et al. | 257/652 |
| 2004/0094839 A1 * | 5/2004 | Fitzsimmons et al. | 257/758 |
| 2005/0042889 A1 * | 2/2005 | Lee et al | 438/780 |

FOREIGN PATENT DOCUMENTS

| | | |
|---|---|---|
| JP | 2002-083869 A | 3/2002 |
| JP | 2002-083870 A | 3/2002 |
| KR | 2001-021194 A | 3/2001 |
| KR | 2001-082085 A | 8/2001 |

* cited by examiner

| WNO.4 | The small carbon content (50nm) |
| --- | --- |
| WNO.6 | The small carbon content (10nm) + The large carbon content (40nm) |
| WNO.7 | The large carbon content (50nm) |

(a)

(b)

(c)

(d)

(a)

(b)

(c)

SEMICONDUCTOR DEVICE AND MANUFACTURING METHOD THEREOF

BACKGROUND OF THE INVENTION

1. Field of the Invention

The present invention relates to a semiconductor device and a manufacturing method thereof and more particularly to a semiconductor device comprising a multi-layered interconnection that is formed by the damascene method and a manufacturing method thereof.

2. Description of the Related Art

In recent years, accompanying the progress in technology to attain higher integration of the semiconductor device and smaller chip size, further miniaturization of the interconnection and wider application of multi-layered interconnection have been being made, and, as the method of forming the multi-layered interconnection structure, there has become in wide use what is called the damascene process wherein the interconnection or the via plug is formed by filling up the interconnection trench or the via hole with Cu and then applying the planarization by the CMP (Chemical Mechanical Polishing) method thereto. Although this damascene process certainly enables the interconnections to be spaced densely, the interconnections once placed close to one another may bring about a problem of signal delay owing to the parasitic capacitances between these interconnections. In order to overcome the problem of this signal delay, the reduction of the interconnection capacitance is, therefore, a matter of great importance.

As the method of reducing the interconnection capacitance, the method in which a material with a low dielectric constant is utilized for the interlayer insulating film, in place of a conventional $SiO_2$-based insulating film, has been much investigated. Now, referring to the drawings, a conventional damascene process wherein a low-dielectric-constant film is employed as an interlayer insulating film is described. FIGS. 11 and 12 are schematic cross-sectional views illustrating, in sequence, the steps of a conventional damascene method.

First, as shown in FIG. 11(a), after a first barrier film 2 and a first interlayer insulating film 3 are grown, in succession, on a substrate 1, coatings of an anti-reflection film and a photoresist are successively applied onto the first interlayer insulating film 3 and, then, the exposure and the development are performed to form a resist pattern (not shown in the drawings), and with this resist pattern being used as a mask, a first interconnection trench is formed by a known technique of dry etching. Next, after the resist pattern and the anti-reflection film are removed by means of oxygen ashing, depositions of a first barrier metal 4 and Cu are applied thereto and, then, by removing portions of the first barrier metal 4 and Cu overlaid the first interlayer insulating film 3, a lower layer interconnection 5 is formed.

Next, as shown in FIG. 11(b), on this lower layer interconnection 5, a second barrier film 6 of SiCN that prevents the Cu diffusion and acts as an etching stopper in the via hole formation and a second interlayer insulating film 7 made of a film of a low-dielectric-constant material such as SiOC, hydrogen silsesquioxane (referred to as HSQ hereinafter) or methyl silsesquioxane (referred to as MSQ hereinafter) are grown in succession. After that, coatings of an anti-reflection film and a photoresist are successively applied onto the second interlayer insulating film 7 and, then, the exposure and the development are performed to form a resist pattern (not shown in the drawings) for the formation of a via hole 7a, and with this resist pattern being used as a mask, a second interlayer insulating film 7 is etched by a known technique of dry etching. Next, after the resist pattern and the anti-reflection film are removed by means of oxygen ashing, the second barrier film 6 is etched by etch back to form a via hole 7a to run through the second interlayer insulating film 7 and the second barrier film 6.

Next, as shown in FIG. 11(c), depositions of a second barrier metal 8 that is to be used as a base for the interconnection material and Cu 9a are applied thereto and thereafter, as shown in FIG. 11(d), portions of the second barrier metal 8 and the Cu 9a overlaid the second interlayer insulating film 7 are removed, and thereby a via plug 9 connecting with the lower layer interconnection 5 is formed.

After that, in the same way as described above, a third barrier film 10 and a third interlayer insulating film 11 are grown thereon, and, using known techniques of photolithography and dry etching, a second interconnection trench 11a is formed (See FIG. 12(a)), and then, after depositions of a third barrier metal 12 and Cu 13a are made (See FIG. 12(b)), portions of the third barrier metal 12 and the Cu 13a overlaid the third interlayer insulating film 11 are removed by the CMP method to form an upper layer interconnection 13 (See FIG. 12(c)). A semiconductor device with a prescribed multi-layered interconnection structure may be fabricated by performing these steps repeatedly.

In such a damascene process, the barrier film must perform not only a function of preventing Cu in an underlying interconnection or via plug from diffusing out into its overlying interlayer insulating film but also a function of acting as an etching stopper when a via hole or an interconnection is subsequently formed in that overlying interlayer insulating film. If, for example, the second barrier film 6 cannot perform as the etching stopper satisfactorily, when the second interlayer insulating film 7 is etched in the step of FIG. 11(b), the etching without being stopped by the second barrier film 6 proceeds to expose the lower layer interconnection 5, and, as a result, in the oxygen ashing which is carried out to remove the resist pattern, the surface of the lower layer interconnection 5 may be oxidized, and the faulty connection between the lower layer interconnections 5 and the via plug 9 may be brought about. To overcome the above problem, it is essential for the barrier film to provide a high etching selection ratio of the overlying interlayer insulating film thereto and, from this viewpoint, a material such as SiC, SiN or SiCN is generally employed.

Further, regarding the deposition of the barrier film with SiN, for example, in Japanese Patent Application Laid-open No. 9150/2002, there is set a problem that, as the deposition temperature of SiN is 400° C. or so, Cu becomes more liable to aggregate and the homology of the Cu surface may deteriorate, with rising the substrate temperature. One of the methods to suppress the Cu aggregation is obviously setting the deposition temperature lower, but if the deposition temperature is set low, the film of SiN may become an insulating film of low density, which cannot provide a satisfactory etching selection ratio of the interlayer insulating film of $SiO_2$ or such. Accordingly, in the above publication, it is disclosed that a barrier film (a Cu-diffusion preventive insulating film) is made to have a layered structure composed of a first insulating film grown at a low temperature below 350° C. by the CVD (Chemical Vapor Deposition) method and a second insulating film grown at a high temperature in a range of 350° C. to 450° C. Inclusive by the CVD method, and, therein, the Cu aggregation is suppressed by making the deposition temperature of the film on the side of the interconnection low, while the drop of the etching selection ratio is prevented by making the deposition temperature of the film on the side of the interlayer insulating film high.

Further, when a low-dielectric-constant film is used as an interlayer insulating film, it is required to lower the dielectric constant of the barrier film as well so that the parasitic capacitance between the interconnections may be reduced. The dielectric constant of the SiN-based barrier film is considerable high, and when a fluorine-containing film of SiOF or such is used as the underlying interlayer insulating film and this film is subjected to the plasma etching, the SiN-based film may be damaged by fluorine radicals produced in that etching. Meanwhile, the SiC-based barrier film may have advantages of the excellent etching selection ratio and the low dielectric constant in the region of 5 but also disadvantage of the insufficient capability to prevent the Cu diffusion. Accordingly, there are disclosed, in Japanese Patent Application Laid-open No. 83869/2002, a structure wherein, on an interlayer insulating film (a first insulating layer) with a low dielectric constant where a trench or a hole is set, there is formed a second insulating layer whose main constituent elements are Si, C and N, wherein the ratio of the number of C atoms to the number of Si atoms is set to be 0.2 to 0.8 and the ratio of the number of N atoms to the number of Si atoms is set to be 0.15 to 1.0; and further in Japanese Patent Application Laid-open No. 83870/2002, another structure wherein a second insulating layer contains $10^{21}$ to $10^{22}$ ($cm^{-3}$) carbon-hydrogen bond containing groups ($CH_n$ groups), whereby both the low dielectric constant and the high etching selection ratio may be attained.

Nevertheless, in the art described in Japanese Patent Application Laid-open No. 9150/2002, only the functions of preventing the Cu diffusion and acting as the etching stopper are considered as the functions necessary for the barrier film, and the dielectric constant is not taken into account, at all. In consequence, even if the low-dielectric-constant film is used as the interlayer insulating film, the barrier film may increase the overall dielectric constant so that a problem that the interconnection capacitance cannot be reduced sufficiently may remain.

Further, in Japanese Patent Application Laid-open No. 83869/2002 and Japanese Patent Application Laid-open No. 83870/2002, it is described that the SiCN-based insulating film that is set to overlie the interlayer insulating film and act as an etching stopper in each structure can provide a high etching selection ratio of the underlying interlayer insulating film thereto, a low dielectric constant as well as an excellent function of making the metal diffusion low. However, in the case of the SiCN-based insulating film, when its C content becomes larger, the etching selection ratio falls, but when its C content becomes smaller, its dielectric constant increases so that the reduction of the interconnection capacitance cannot be achieved. In effect, the structures described in these publications cannot provide the rise of the etching selection ratio and the reduction of the dielectric constant, simultaneously.

Further, for the barrier film, in addition to the above functions, it is essential to have good adhesiveness to Cu that is an interconnection material. Unless the adhesion between Cu and the barrier film is kept well, Cu atoms on the interconnection surface become liable to move, giving rise to a problem of deterioration of the electromigration resistance. Yet, in the above publications, the adhesiveness between Cu and the barrier film is not taken into consideration, at all.

In short, in the damascene method wherein the Cu interconnection is formed by the CMP method, it is important for the barrier film formed between the Cu interconnection and its overlying interlayer insulating film to meet the following four demands; that is, 1. the etching selection ratio of the interlayer insulating film thereto should be high; 2. the Cu diffusion should be prevented with effect; 3. the dielectric constant should be low; and 4. it should adhere well to the Cu interconnection, and a new proposal for the barrier film capable to satisfy all these demands has been long waited for.

In light of the above problems, the main object of the present invention is to provide a semiconductor device which comprises a barrier film having a high etching selection ratio of the interlayer insulating film thereto, a good preventive function against the Cu diffusion, a low dielectric constant and excellent adhesiveness to the Cu interconnection and a manufacturing method thereof.

SUMMARY OF THE INVENTION

Accordingly, the present invention provides a semiconductor device equipped with an interconnection or a via plug, being formed by the damascene method; which comprises a structure in which a barrier film made of a plurality of layered films containing silicon and carbon, with different carbon contents, is disposed between said interconnection or said via plug and its overlying layer that is an interlayer insulating film.

Further, the present invention provides a semiconductor device equipped with an interconnection or a via plug, being formed by the damascene method; which comprises a structure in which a barrier film made of a plurality of layered films containing silicon, carbon and nitrogen, with different carbon contents, is disposed between said interconnection or said via plug and its overlying layer that is an interlayer insulating film.

Further, in the present invention, said barrier film may comprise, on the side of said interconnection or said via plug, a low-carbon-concentration film with a small carbon content and, on the side of said interlayer insulating film, a high-carbon-concentration film with a carbon content larger than that of said low-carbon-concentration film, and it is preferable that when, in the infrared absorption spectrum for said barrier film, infrared absorption areas of infrared absorption bands having a peak in the vicinity of 810 $cm^{-1}$ and having a peak in the vicinity of 1250 $cm^{-1}$ are denoted by I1 and I2, respectively, a value of I2/I1 for said low-carbon-concentration film in said barrier film is approximately 0.004 to 0.0067 and a value of I2/I1 for said high-carbon-concentration film in said barrier film is approximately 0.0067 to 0.014.

Further, in the present invention, viewed from the point of the etching selectivity, it is most effective, if said interlayer insulating film formed on said barrier film is a low-dielectric-constant film whose main constituent elements are silicon, carbon and oxygen.

Further, the present invention provides a method of manufacturing a semiconductor device wherein an interconnection or a via plug is formed by the damascene method; which comprises the steps of disposing a barrier film made of a plurality of layered films containing silicon and carbon, with different carbon contents, between said interconnection or said via plug and its overlying layer that is an interlayer insulating film.

Further, the present invention provides a method of manufacturing a semiconductor device wherein an interconnection or a via plug is formed by the damascene method; which comprises the steps of disposing a barrier film made of a plurality of layered films containing silicon, carbon and nitrogen, with different carbon contents, between said interconnection or said via plug and its overlying layer that is an interlayer insulating film.

Further, the present invention provides a method of manufacturing a semiconductor device, which comprises at least the steps of: forming, on a substrate in which an interconnection or a via plug is formed, a barrier film wherein, at least, a low-carbon-concentration film containing silicon, carbon and nitrogen, with a small carbon content, and a high-carbon-concentration film containing silicon, carbon and nitrogen, with a carbon content larger than that of said low-carbon concentration film, are laid in this order; forming, on said barrier film, an interlayer insulating film, main constituent elements of which are silicon, carbon and oxygen; performing dry etching, while using a resist pattern formed on said interlayer insulating film as a mask and said low-carbon-concentration film as an etching stopper, and thereby removing said interlayer insulating film and said high-carbon-concentration film; removing said resist pattern by means of ashing with an oxygen-containing gas; removing said low-carbon-concentration film by etch back to form a via hole or an interconnection trench; and filling up said via hole or said interconnection trench with a barrier metal and an interconnection material, and thereby forming a via plug or an interconnection.

Further, the present invention provides a method of manufacturing a semiconductor device, which comprises at least the steps of: forming, on a substrate in which a first interconnection is formed, a first barrier film wherein, at least, a low-carbon-concentration film containing silicon, carbon and nitrogen, with a small carbon content, and a high-carbon-concentration film containing silicon, carbon and nitrogen, with a carbon content larger than that of said low-carbon concentration film, are laid in this order; forming, on said first barrier film, a first interlayer insulating film, a second barrier film and a second interlayer insulating film, main constituent elements of any of which are silicon, carbon and oxygen; performing dry etching, while using a first resist pattern formed on said second interlayer insulating film as a mask and said low-carbon-concentration film as an etching stopper, and thereby removing said second interlayer insulating film, said second barrier film, said first interlayer insulating film and said high-carbon-concentration film; removing said first resist pattern by means of ashing with an oxygen-containing gas; performing dry etching, while using a second resist pattern formed on said second interlayer insulating film as a mask and said second barrier film as an etching stopper, and thereby removing said second interlayer insulating film; removing said second resist pattern by means of ashing with an oxygen-containing gas; removing said low-carbon-concentration film by etch back to form an interconnection trench that includes a via hole; and filling up said interconnection trench with a barrier metal and an interconnection material, and thereby forming a second interconnection.

Further, in the present invention, with the plasma CVD method being used, said barrier film or said first barrier film is preferably formed continuously in one and the same chamber, changing the source gas pressure, and one of trimethylsilane, tetramethylsilane and trimethylvinylsilane may be used for said source gas. Especially when a SiCN-based material is used, it is preferable that, using the plasma CVD method with a source gas of trimethylsilane, $NH_3$ and He, said low-carbon-concentration film is grown at a gas pressure of approximately 330 to 530 Pa, while said high-carbon-concentration film is grown at a gas pressure of approximately 530 to 730 Pa.

As set forth above, in the present invention, the barrier film disposed between the interconnection or the via plug and its overlying interlayer insulating film is made to have a layered structure made of a plurality of films, with different carbon contents, and, in particular, a low-carbon-concentration film with a small carbon content is set to be a lower layer therein and a high-carbon-concentration film with a large carbon content is set to be an upper layer therein, whereby the effectual prevention against the Cu diffusion, a high etching selection ratio and good adhesiveness to the Cu interconnection can be certainly provided by the presence of the low-carbon-concentration film, while the overall dielectric constant can be well reduced by the presence of the high-carbon-concentration film, and, therefore all requirements made for the barrier film may be satisfied.

DETAILED DESCRIPTION OF THE INVENTION AND PREFERRED EMBODIMENTS

As described in Prior Art, for the purpose of reducing the capacitance between the interconnections in the multi-layered interconnection, the use of the low-dielectric-constant film of SiOC, HSQ, MSQ or such for the interlayer insulating film has become wide spreading, and for the barrier film that is to be disposed between the interconnection or the via plug and its overlying interlayer insulating film, it is important to satisfy the following four requirements at the same time, that is, to prevent the Cu diffusion; to make the etching selection ratio of the interlayer insulating film thereto high; to make the dielectric constant low and to adhere well with the interconnection or the via plug.

However, in a conventional example (Japanese Patent Application Laid-open No. 9150/2002) wherein a SiCN-based barrier film has a layered structure composed of a first insulating film grown at a low temperature and a second insulating film grown at a high temperature, neither the dielectric constant nor the adhesiveness of the film is taken into consideration, while in another conventional example (Japanese Patent Application Laid-open No. 83869/2002) wherein, in the SiCN-based barrier film, the ratio of the number of C atoms to the number of Si atoms and the ratio of the number of N atoms to the number of Si atoms are set to be 0.2 to 0.8 and 0.15 to 1.0, respectively, and in another conventional example (Japanese Patent Application Laid-open No. 83870/2002) wherein the SiCN-based barrier film contains $10^{21}$ to $10^{22}$ $(cm^{-3})$ carbon-hydrogen bond containing groups, the adhesiveness is not taken into consideration and, therefore, none of these structures can meet the above four requirements all.

The present inventors noticed that, in the SiC-based or SiCN-based insulating film whose constituent elements include at least silicon and carbon, the carbon content has a close relationship with the etching selection ratio, the preventive capability against the Cu diffusion, the dielectric constant and the adhesiveness to Cu, and, from the experiments made on these relationships, found out that the dielectric constant is lowered with increasing carbon content in the barrier film, while the etching selectivity, the preventive capability against the Cu diffusion and the adhesiveness to Cu is heightened with decreasing carbon content therein.

Figure 1:
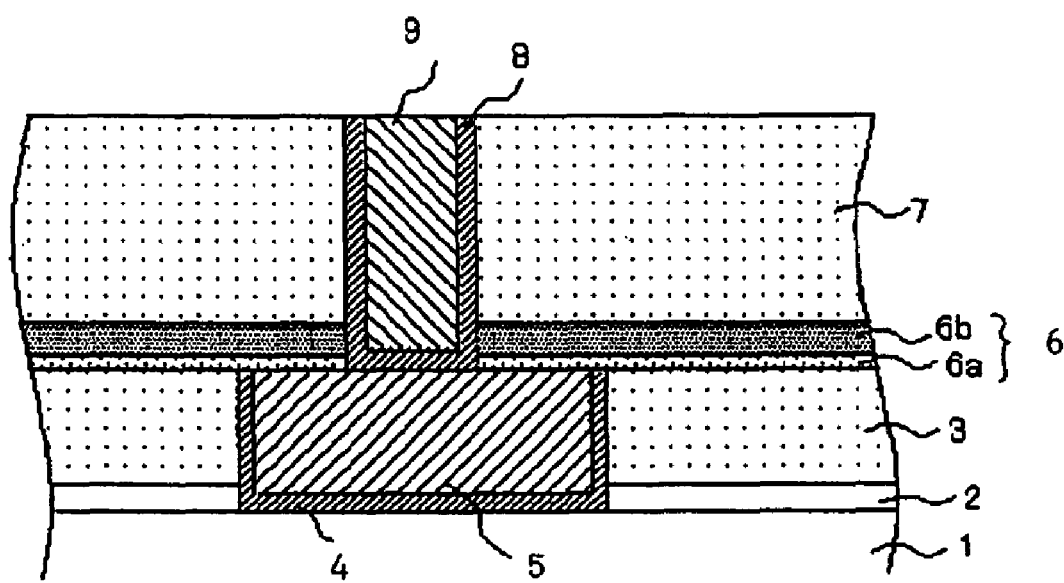
FIG. 1 is a schematic cross-sectional view showing a structure of a semiconductor device comprising a barrier film according to First Example of the present invention.

On the basis of the above experimental results, as shown in FIG. 1, a barrier film (in the drawing, a second barrier film 6 disposed between a lower layer interconnection 5 and a second interlayer insulating film 7 made of a low-dielectric-constant film of SiOC or such) disposed between an interconnection or a via plug and its overlying interlayer insulating film was made to have a layered structure made of a plurality of films with different carbon contents (in the drawing, a double-layered structure composed of a low-carbon-concentration film 6a with a small carbon content and a high-carbon-concentration film 6b with a large carbon content), and thereby it was confirmed that the presence of the low-carbon-concentration film 6a enables to attain high etching selectivity, effectual Cu-diffusion prevention and excellent adhesiveness to Cu, while the presence of the high-carbon-concentration film 6b enables to reduce the overall dielectric constant for the second barrier film 6.

To further illustrate the foregoing embodiments of the present invention, examples of the present invention are described in detail below, with reference to the drawings.

EXAMPLE 1

Figure 2:
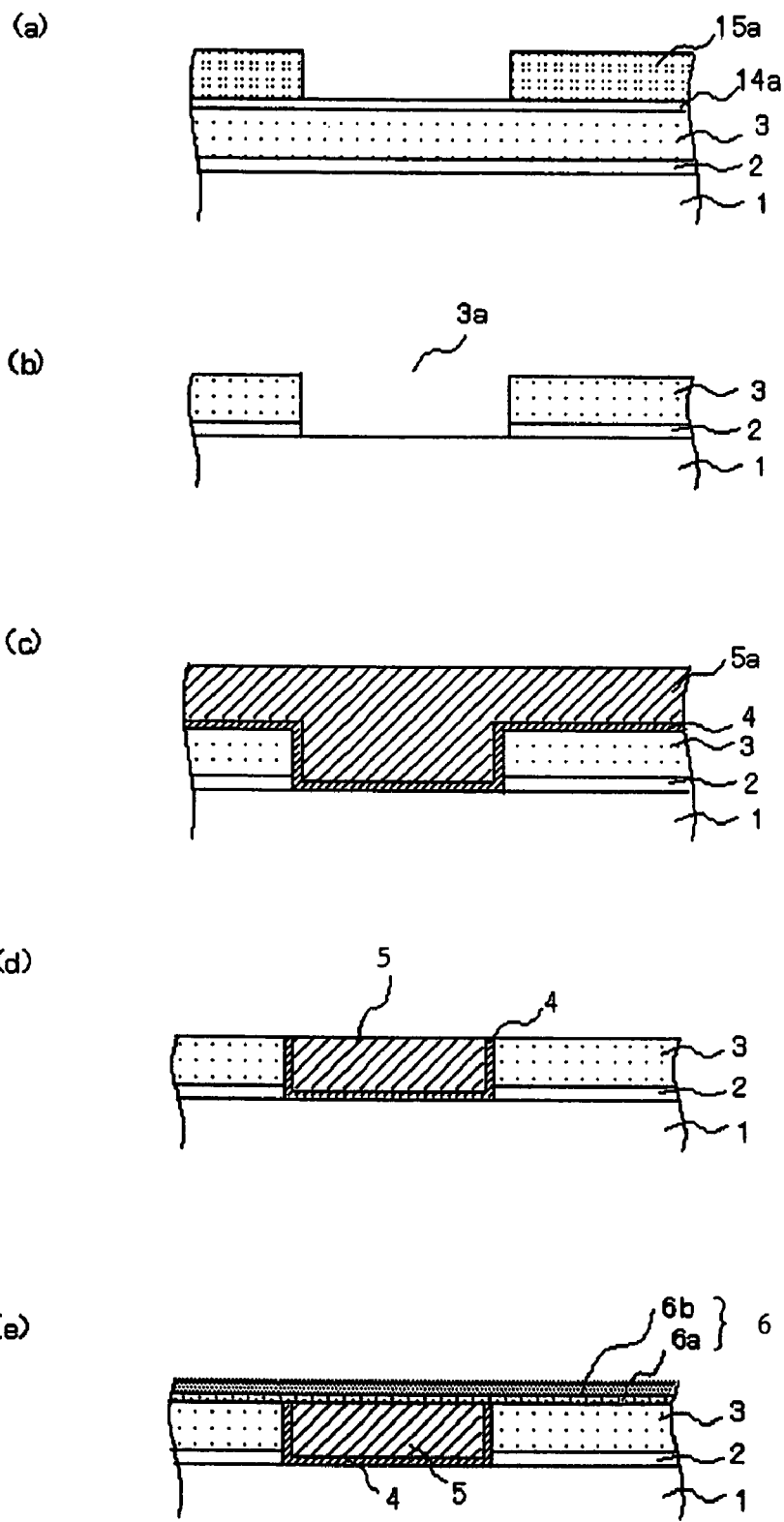
FIGS. 2(a)-(e) are a series of schematic cross-sectional views illustrating the steps of a manufacturing method (a single damascene process) of a semiconductor device comprising a barrier film according to First Example of the present invention.
Figure 3:
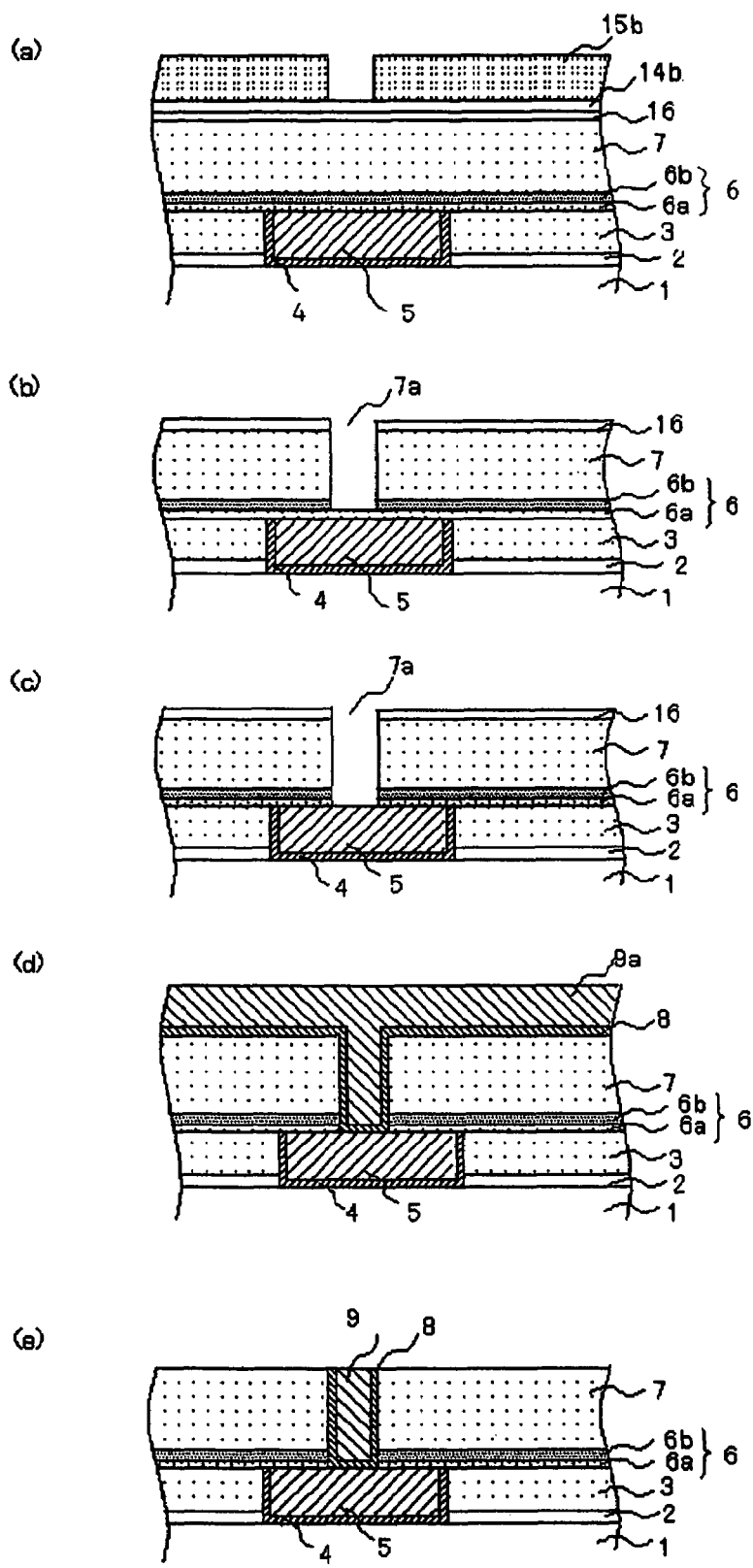
FIGS. 3(a)-(e) are a series of schematic cross-sectional views illustrating further steps of the manufacturing method (the single damascene process) of a semiconductor device comprising a barrier film according to First Example of the present invention.
Figure 4:
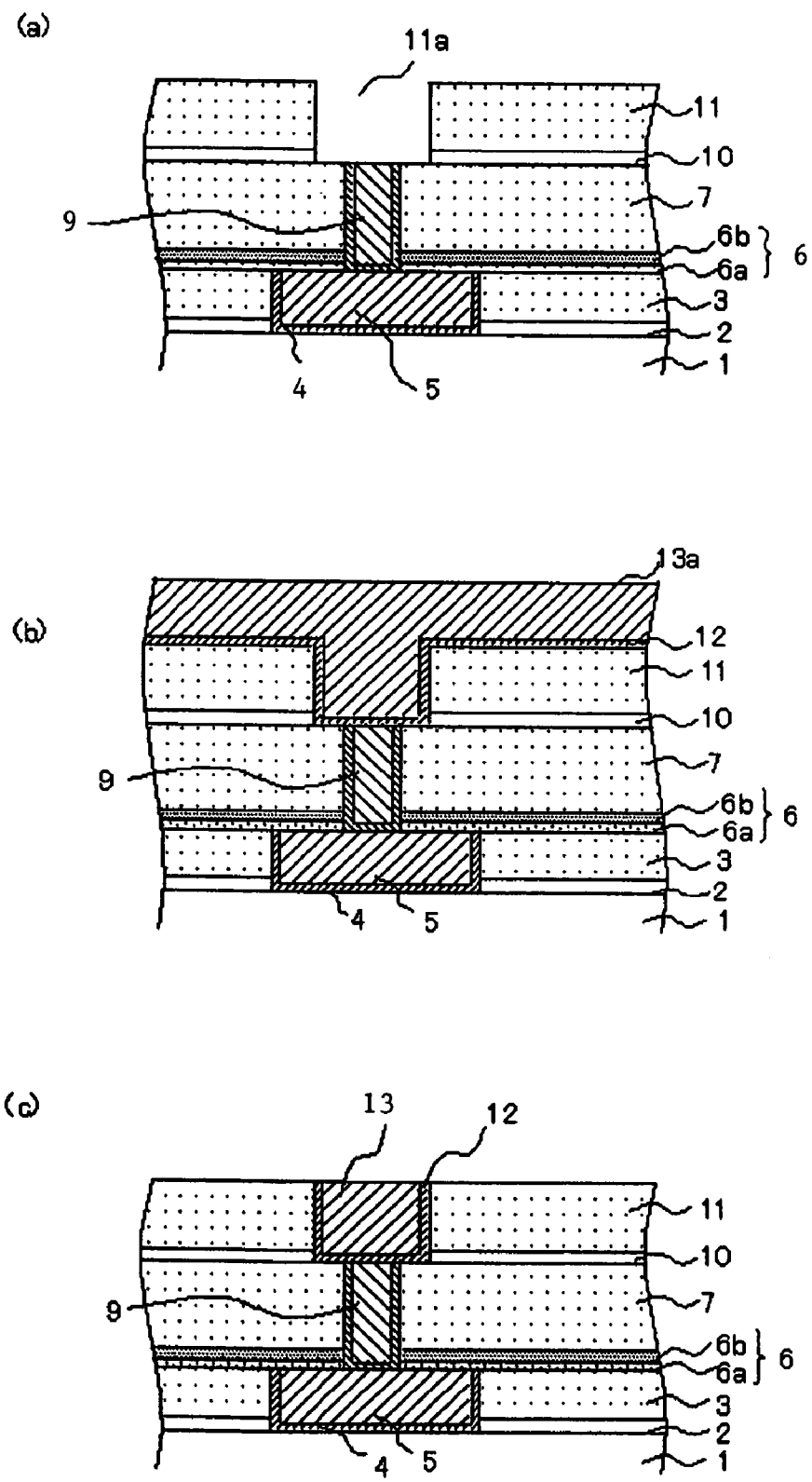
FIGS. 4(a)-(c) are a series of schematic cross-sectional views illustrating further steps of the manufacturing method (the single damascene process) of a semiconductor device comprising a barrier film according to First Example of the present invention.
Figure 5:
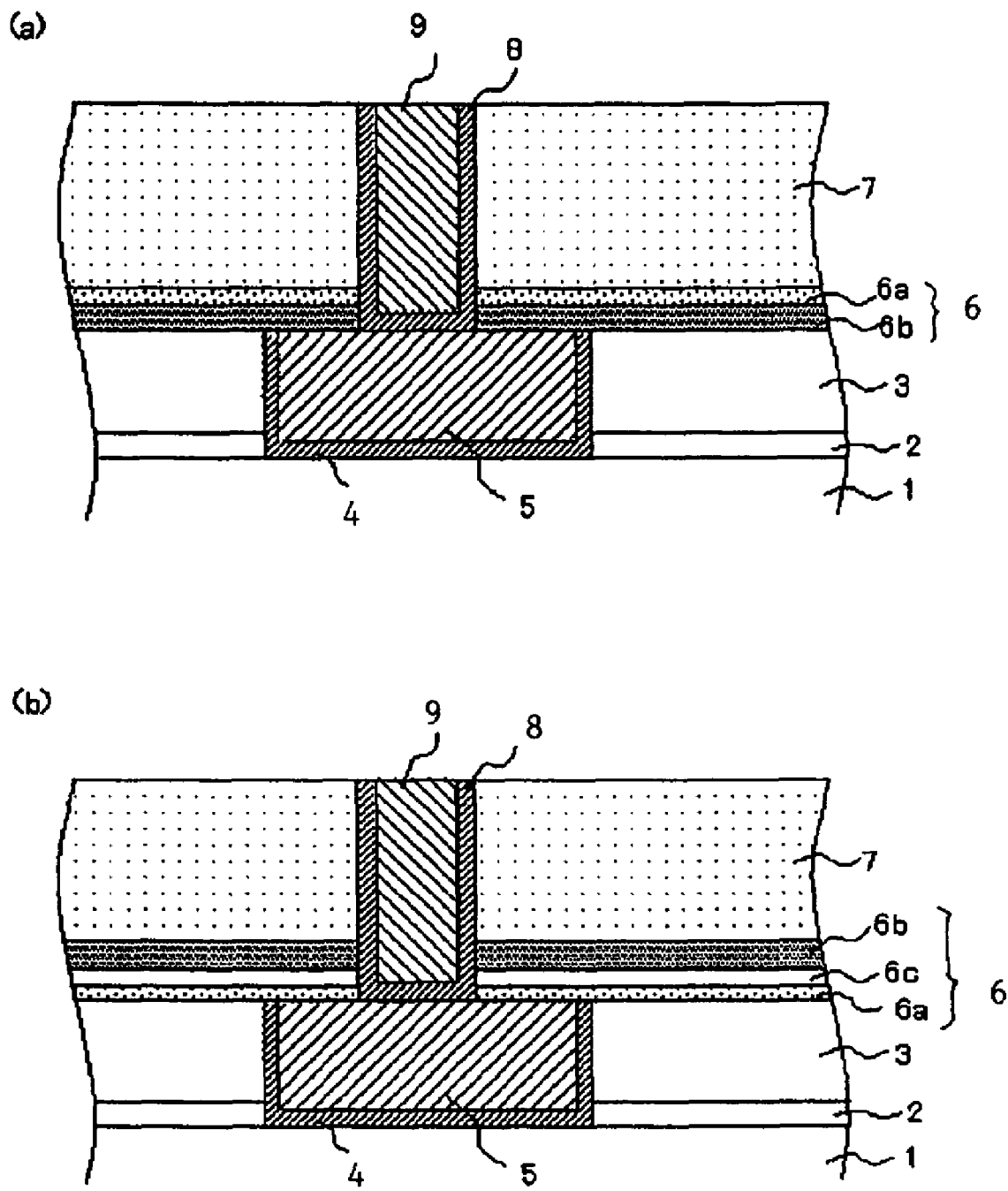
FIGS. 5(a)-(b) are a pair of schematic cross-sectional views each showing another structure of a semiconductor device comprising a barrier film according to First Example of the present invention.
Figure 6:
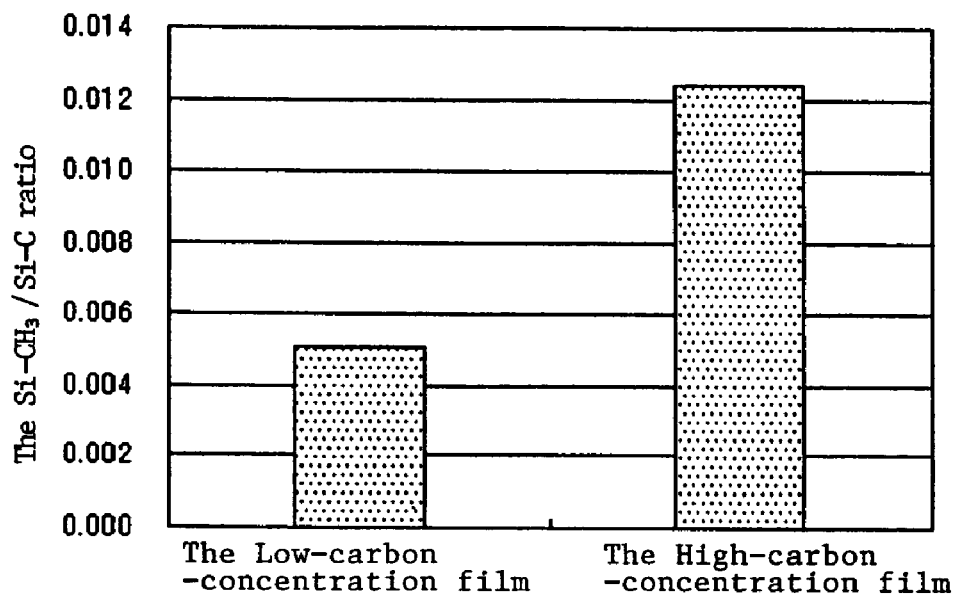
FIG. 6 is a graphical representation showing chemical compositions of the low-carbon-concentration film and high-carbon-concentration film.
Figure 7:
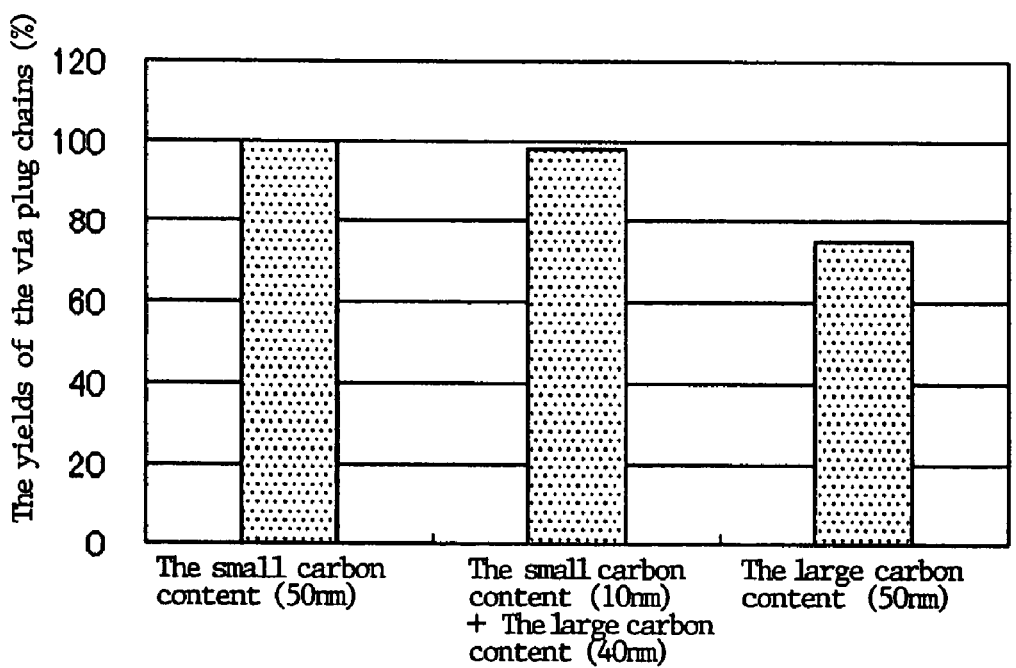
FIG. 7 is a graphical representation showing the yields of the via plug chains for the barrier film with a layered structure of First Example, and the barrier films composed of a low-carbon-concentration film alone and a high-carbon-concentration film alone.
Figure 8:
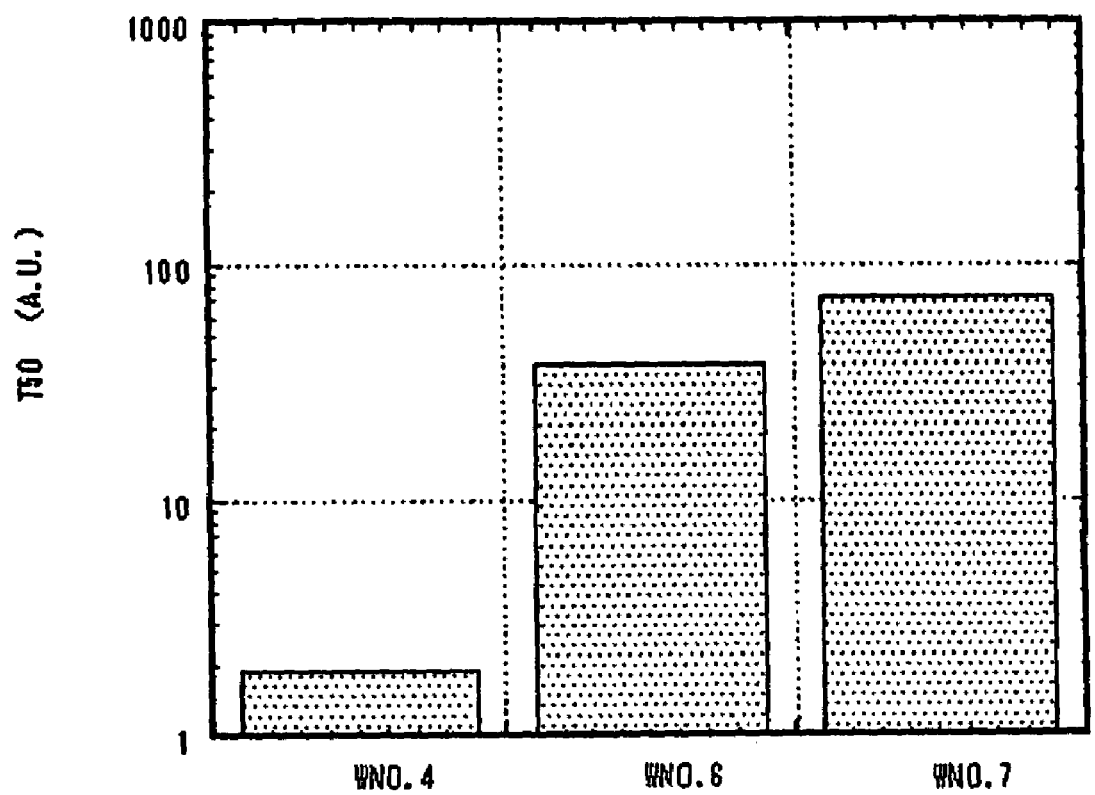
FIG. 8 is a graphical representation showing the EM lifetimes for the barrier film with a layered structure of First Example, and the barrier films composed of a low-carbon-concentration film alone and a high-carbon-concentration film alone.

First, referring to FIGS. 2 to 8, a semiconductor device according to First Example of the present invention and a manufacturing method thereof are described. FIGS. 2 to 4 are schematic cross-sectional views illustrating, in sequence, the steps of a manufacturing method of a semiconductor device comprising a barrier film of the present invention, and, for the convenience of the drawings, they are divided into three figures. Further, FIG. 5 is a pair of schematic cross-sectional views each showing another structure of a barrier film according to the present invention, and FIGS. 6 to 8 are graphical representations in explaining the effects the barrier film of the present invention have.

Referring to FIGS. 2 to 4, a manufacturing method of a semiconductor device comprising a barrier film of the present invention is described below. While, the following description for the present example is made for a single damascene process, and herein a second interlayer insulating film in which a via hole is formed is a low-dielectric-constant film and a second barrier film disposed between a lower layer interconnection and a second interlayer insulating film has a layered structure of films with different carbon contents, the present invention is not limited to the example described below and can be applied to various modified embodiments. For instance, for any given interlayer insulating film, a low-dielectric-constant film can be employed, and, although a layered structure of the present invention must be applied to at least one barrier film, no upper limit exists for the number of barrier film(s) having each layered structure. Further, while the present example is described to use Cu as the interconnection material and form an interconnection or a via plug by the CMP method, the present invention obviously can be applied to any method in which a Cu alloy, tungsten or the like is utilized as the interconnection material, and an interconnection or a via plug is formed by the etch back method.

First, as shown in FIG. 2(a), on a substrate 1 in which elements such as MOS (Metal-Oxide-Semiconductor) transistors are formed, a first barrier film 2 and a first interlayer insulating film 3 are formed by the CVD method, the plasma CVD method or the like in succession and, with coatings of an anti-reflection film 14 with a thickness of 50 nm or so for suppressing the reflection in exposure and a chemically amplified resist with a thickness of 600 nm or so being applied thereto, the exposure and the development are carried out by means of KrF photolithography to form a resist pattern 15a that is to be used for formation of a first interconnection trench 3a. The materials for the first barrier film 2 and the first interlayer insulating film 3 can be appropriately selected from the group of $SiO_2$, SiN, SiON, SiC, SiCN and the like as long as a combination of these two materials can provide a good etching selection ratio.

Following that, as shown in FIG. 2(b), after the first interlayer insulating film 3 is etched by a known technique of dry etching, the resist pattern 15a and the anti-reflection film 14a are removed by the oxygen plasma ashing, and then the first barrier film 2 is etched by means of etch back, and thereby a first interconnection trench 3a cutting through the first interlayer insulating film 3 and the first barrier film 2 is formed.

Next, a's shown in FIG. 2(c). using the sputtering method, the deposition of a first barrier metal is applied thereto, to a thickness of 20 nm or so, to form a single-layered film of Ti, TiN, Ta, TaN, WN or the like or a layered film composed of two or more layers selected from a group of the foregoing films, and, then, to facilitate the plating growth of Cu that is to be used as the interconnection material, a seed metal of Cu (not shown in the drawing) is formed to a thickness of 100 nm or so. Following that, after Cu 5a is formed by the electroplating method to a thickness of 600 nm or so to fill up the inside of the first interconnection trench 3a with Cu 5a, portions of the Cu 5a and the first barrier metal 4 lying on the first interlayer insulating film 3 are removed by the CMP method, as shown in FIG. 2(d), and thereby a lower layer interconnection 5 is formed in the first interlayer insulating film 3.

Next, as shown in FIG. 2(e), using the CVD method, the plasma CVD method or the like, a second barrier film 6 of a SiC-based or a SiCN-based material whose constituent elements include silicon and carbon is formed to a thickness of 20 to 80 nm or so. This second barrier film 6 is required to be able to provide, thereto, a high etching selection ratio of the second interlayer insulating film 7 that is to be formed thereon, prevent surely the Cu diffusion out of the lower layer interconnection 5 into the second interlayer insulating film 7, provide a dielectric constant low enough to be able to reduce the interconnection capacitance between the lower layer interconnection 5 and the upper layer interconnection 13 and adhere well to the lower layer interconnection 5. For that purpose, after forming a low-carbon-concentration film 6a with a small carbon content, a high-carbon-concentration film with a large carbon content is formed in one and the same chamber, and satisfactory etching selection ratio, Cu diffusion prevention and adhesiveness to the lower layer interconnection are secured by the presence of the low-carbon-concentration film 6a, and sufficient reduction of the dielectric constant is brought about by the presence of the high-carbon-concentration film 6b.

With regard to a manufacturing method of a SiCN-based second barrier film, for example, using a parallel plate type plasma CVD apparatus and feeding, as source gases, trimethylsilane (3MS), $NH_3$ and He at flow rates of 100 to 200 sccm (standard cubic centimeters minute) or so, 250 to 400 sccm or so and 250 to 400 sccm or so, respectively, the deposition thereof can be carried out under the conditions that the substrate temperature is 300 to 350° C. or so and the power is 250 to 400 W or so.

When a mixed gas of trimethylsilane, $NH_3$ and He is used as a source gas, the second barrier film 6 is formed, containing various components such as Si—$CH_3$ bonds, Si—$CH_2$ bonds, Si—C bonds, Si—N bonds, Si—H bonds and the like, and through the change in gas pressure, the ratio of the number of the Si—$CH_3$ bonds to the number of the Si—C bonds can be changed and, thus, the carbon concentration contained in the second barrier film 6 can be also changed. For instance, when the gas pressure in the chamber is set to be 2.5 to 4.0 Torr (approximately 330 to 530 Pa) or so, the low-carbon-concentration films 6 are formed, and when the gas pressure is set to be 4.0 to 5.5 Torr (approximately 530 to 730 Pa) or so, the high-carbon-concentration films 6b are formed.

The ratios of the number of the Si—$CH_3$ bonds to the number of the Si—C bonds contained in the low-carbon-concentration films 6a and the high-carbon-concentration films 6b grown in respective foregoing gas pressures are shown in FIG. 6. FIG. 6 indicates that while the Si—$CH_3$/Si—C ratio in the low-carbon-concentration films 6a is approximately 0.005, the ratio in the high-carbon-concentration films 6b is approximately 0.0125 and, thus, the proportion of the Si—$CH_3$ bonds in the high-carbon-concentration films 6b is shown to be higher than that in the low-carbon-concentration films 6a.

Further, the film compositions of the low-carbon-concentration films 6a and the high-carbon-concentration films 6b can be examined by the FTIR (Fourier Transform InfraRed) spectroscopy. Specifically, the Si—$CH_3$ bonds have a peak in the vicinity of 1250 $cm^{-1}$, while the Si—C bonds have a peak in the vicinity of 810 $cm^{-1}$. When the surrounded area of the absorption band from 1300 to 1220 $cm^{-1}$ is denoted by I2 and that from 1220 to 600 $cm^{-1}$, by I1, the ratios obtained are as follows. I2/I1=0.004 to 0.0067 for the low-carbon-concentration films 6a and I2/I1=0.0067 to 0.014 for the high-carbon-concentration films 6b and, thus, the proportion of the Si—$CH_3$ bonds in the high-carbon-concentration films 6b is shown to be higher than that in the low-carbon-concentration films 6a.

Herein, the carbon contents and the film thicknesses of the low-carbon-concentration film 6a and the high-carbon-concentration film 6b are appropriately set, depending on the etching selection ratio of the interlayer insulating film that is to be formed thereon thereto, the acceptable value of the capacitance between the interconnections and such, and their values are not specifically limited. Further, although the low-carbon-concentration film 6a and the high-carbon-concentration film 6b are distinct from each other in the drawings, it is sufficient, in practice, if the top section and the bottom section of the second barrier film 6 have different carbon contents, and even the second barrier film 6 can have a structure in which the carbon content gradually changes along the direction of the film thickness (along the vertical direction in the drawing).

Next, as shown in FIG. 3(a), on the second barrier film 6, a second interlayer insulating film 7 is formed to a thickness of 150 to 300 nm or so by the CVD method, the plasma CVD method, the coating method or the like. For instance, when SiOC is used for the second interlayer insulating film 7, there may be employed a manufacturing method wherein a parallel plate type plasma CVD apparatus is used and trimethylsilane (3MS), $O_2$ and $H_2$ are fed thereto, as source gases, at flow rates of 500 to 1500 sccm or so, 300 to 500 sccm or so and 150 to 400 sccm or so, respectively, and the deposition is made under the conditions that the substrate temperature is 330 to 400° C. or so and the power is 600 to 750 W or so. Further, when a material other than $SiO_2$ is employed for the second interlayer insulating film 7, a film of $SiO_2$ that is to be used for a hard mask (a hard mask film 16) is formed thereon to a thickness of 50 to 200 nm or so. Hereat, it is not necessarily required to use a low-dielectric-constant film for the second interlayer insulating film 7, but the effects of a barrier film of the present invention become markedly clear when a film of SiOC, HSQ, MSQ or the like or any of such a film after being subjected to a treatment of increasing porosity is used.

Following that, after an anti-reflection film 14b for suppressing the reflection in exposure is grown to a thickness of 50 nm or so on the second interlayer insulating film (or a cap insulating film 16), a coating of a chemically amplified resist for via hole pattern formation is applied thereto to a thickness of 600 nm or so, and the exposure and the development are carried out by means of KrF photolithography to form a resist pattern 15b. Subsequently, using the low-carbon-concentration film 6a as an etching stopper, the anti-reflection film 14b, the second interlayer insulating film 10 and the high-carbon-concentration film 6b are etched in succession by a known technique of dry etching, as shown in FIG. 3(b).

Following that, after the resist pattern 15b and the anti-reflection film 14b are removed by oxygen plasma ashing, the low-carbon-concentration film 6a is etched by etch back as shown in FIG. 3(c), and thereby a via hole 7a is formed to run through the second interlayer insulating film 10, the high-carbon-concentration film 6b and the low-carbon-concentration film 6a.

Now, in the conventional manufacturing method of a semiconductor device, because the etching selection ratio obtained between the second interlayer insulating film (SiOC) 7 and the second barrier film 6 is insufficient, the lower layer interconnection 5 may be exposed at the time of dry etching of the second interlayer insulating film 7, and besides organic components in the second barrier film 6 may be eliminated as $CO_2$ gas on oxygen ashing so that the lower layer interconnection 5 may be oxidized in the step of oxygen ashing, giving rise to a problem of the faulty connection between the lower layer interconnection 5 and a via plug 9 that is to be formed on the lower layer interconnection 5. Especially when a low-dielectric-constant film of SiOC or such is used for the second interlayer insulating film 7, the low-dielectric-constant film itself can be damaged by the oxygen plasma and, to overcome that, with a bias voltage being applied, a directivity is given to the plasma in ashing. This, however, makes the second barrier film 6 more liable to be etched, and the above problem becomes more serious.

In contrast with this, in the structure of the second barrier film 6 of the present example, a low-carbon-concentration film is formed as a lower layer thereof, and the etching selection ratio of the second interlayer insulating film 7 to the low-carbon-concentration film 6a is satisfactorily large and, in addition, the carbon content therein is small and the resistance against the oxygen ashing is high. This enables dry etching for forming the via hole 7a to be stopped surely at the low-carbon-concentration film 6a and, in consequence, the exposure of the lower layer interconnection 5 can be prevented and the oxidation of the lower layer interconnection 5 in the step of ashing can be well suppressed.

Further, since the low-carbon-concentration film 6a has a high capability to prevent the Cu diffusion as well as an excellent adhesiveness to the Cu interconnection, the electromigration resulting from the movements of the Cu atoms can be prevented for certain. Moreover, as the high-carbon-concentration film 6b laid as the upper layer has a low dielectric constant (in the case of manufacturing conditions for the present example, its dielectric constant is 4.3 to 3.5 or so), the dielectric constant of the whole second barrier film 2 can be reduced, and even when an interlayer insulating film with a low dielectric constant is utilized, the capacitance between the interconnections can be made low.

Next, as shown in FIG. 3(d), after the hard mask film 16 is removed, a film of a second barrier metal 8 such as Ti, TiN, Ta, TaN or WN is formed to a thickness of 20 nm or so in order to improve the adhesiveness, and then a film of seed metal of Cu (not shown in the drawing) is formed to a thickness of 100 nm or so. Following that, after Cu 9a that is to be used as the interconnection material is formed by the plating method to a thickness of 600 nm or so to fill up the inside of the via hole 7a, the superfluous portions of the Cu 9a and the second barrier metal 8 are polished by the CMP method so that the surface thereof may be planarized, as shown in FIG. 3(e), whereby a via plug 9 connecting with the lower layer interconnection 5 is formed.

After that, as shown in FIGS. 4(a) to 4(c), a second interconnection trench 11a is formed in a third interlayer insulating film 11, and by filling up its inside with Cu, an upper layer interconnection 13 connecting with the via plug 9 is formed. Performing the above steps a given number of times, a prescribed multi-layered interconnection with a damascene structure may be formed.

To examine the effects of the semiconductor device formed as described above, the following experiments were carried out. Firstly, samples wherein a high-carbon-concentration film 6b with a large carbon content, 50 nm in thickness, was formed alone as the second barrier film 6; samples wherein a low-carbon-concentration film 6a with a small carbon content, 10 nm in thickness, as well as a high-carbon-concentration film 6b with a large carbon content, 40 nm in thickness, were formed as a lower layer and an upper layer of the second barrier film 6, respectively, in the same way as in the present example; and samples wherein a low-carbon-concentration film 6a with a small carbon content, 50 nm in thickness, was formed alone as the second barrier film 6 were fabricated, and the measurements of the electrical resistances were conducted for via plug chains of these samples. The results of these measurements are shown in FIG. 7.

FIG. 7 is a graphical representation showing the yields of the via plug chains (paths wherein the interconnections are linked by via plugs in series). As seen in FIG. 7, the sample using only the high-carbon-concentration film 6b (on the right side of the drawing) has a lower yield of the via plug chain than the sample of the present example having the double-layered structure (in the center of the drawing) and the sample using only the low-carbon-concentration film 6a (on the left side of the drawing), which demonstrates that, because the barrier film of the sample using only the high-carbon-concentration film 6b could not function sufficiently as an etching stopper and the surface of the Cu interconnection was oxidized on the subsequent ashing, faulty connections became liable to occur in the connecting parts between the via plugs and the interconnections. This clearly shows that by making a film whose carbon content is small a part of the barrier film, it is possible to improve the function of the barrier film as an etching stopper.

Further, using the above three types of the samples (WNO.4, WNO.6 and WNO.7), measurements of the electromigration (EM) resistances were made. Their results are shown in FIG. 8. FIG. 8 is a graphical representation showing the EM lifetimes, and therein the wafer standard is presented in horizontal axis and the T50 (in other words, the MTF (Mean Time of Failure)) is plotted in vertical axis. As seen clearly in FIG. 8, while the T50 for the sample (WNO.4) using only the high-carbon-concentration film 6b is short, the T50s for the sample (WNO.6) of the present example having the double-layered structure as well as the sample (WNO.7) using only the low-carbon-concentration film 6a are both long. This clearly demonstrates that by setting the low-carbon-concentration film 6a on the side of the Cu interconnection, the adhesiveness to Cu is raised and the Cu diffusion is prevented effectually and, therefore, a semiconductor device with high reliability can be obtained.

The above experimental results indicate that when the barrier film is composed of, solely, a high-carbon-concentration film 6b with a large carbon content, because the etching selection ratio of the interlayer insulating film thereto is insufficient, the interconnection surface is oxidized in the step of oxygen ashing and the faulty connection between the interconnection and the via plug is liable to occur, and besides its poor adhesiveness between the interconnection and the barrier film deteriorates the EM resistance. In contrast with this, with the structure of the present example wherein a low-carbon-concentration film 6a with a small carbon content is made a part (especially on the side of the interconnection) of the barrier film, the etching selection ratio is increased and, as a result, the oxidation of the interconnection surface is suppressed, which leads to a decrease in electrical resistance of the via plug, an increase in yield of the via plug chain as well as an improvement of adhesiveness to the interconnection and a rise of the EM lifetime. Moreover, since the effects equivalent to those of the sample (WNO.4) using only the low-carbon-concentration film 6a with a small carbon content alone may be obtained with the structure of the present example, it is evidently enough to set a low-carbon-concentration film 6a as a part of the barrier film. Meanwhile, if the barrier film is solely composed of a low-carbon-concentration film 6a, the dielectric constant becomes excessively high. Therefore, it is apparent that only the layered structure of the present example can satisfy, at the same time, four requirements; namely, the high etching selection ratio, the high capability of diffusion prevention, the sufficient reduction of the dielectric constant and the good improvement of the adhesiveness.

In the above description, the second barrier film 6 has a structure in which a low-carbon-concentration film 6a is formed as a lower layer (on the side of the lower layer interconnection 5) and a high-carbon-concentration film 6b is formed as an upper layer (on the side of the second interlayer insulating film 7), but, instead of that, as shown in FIG. 5(a), a high-carbon-concentration film 6b and a low-carbon-concentration film 6a can be formed as a lower layer and an upper layer, respectively. In this instance, the section that comes into contact with the lower layer interconnection 5 is the high-carbon-concentration film 6b so that the adhesiveness to Cu cannot be improved, but the effects of preventing the Cu diffusion, reducing the dielectric constant of the whole second barrier film 6 and acting as an etching stopper for the second interlayer insulating film 7 can be obtained in the same way. Furthermore, it is also possible to have a structure in which a third film 6c (it can be a film with an intermediate carbon content between the other two films or a film having a larger carbon content than the high-carbon-concentration film 6b (a film having a smaller carbon content than the low-carbon-concentration film 6a) or even it can be a film with another composition or another structure) is disposed between the lower layer that is a low-carbon-concentration film 6a (or a high-carbon-concentration film 6b) and the upper layer that is a high-carbon-concentration film 6b (or a low-carbon-concentration film 6a), as shown in FIG. 5(b).

Further, although 3MS (trimethylsilane) is used to fabricate a SiCN film in the above description, the use of 4MS (tetramethylsilane) or TMVS (trimethylvinylsilane) can provide similar effects. Especially when TMVS with a large molecular weight is utilized, the dielectric constant is reduced approximately by 0.5 or so, compared with the case in which 3MS is used. Further, a double-layered structure of SiCN is herein used as the structure of the second barrier film 6, SiC/SiCN (an upper layer of SiC and a lower layer of SiCN) or SiCN/SiC can be utilized, instead.

EXAMPLE 2

Figure 9:
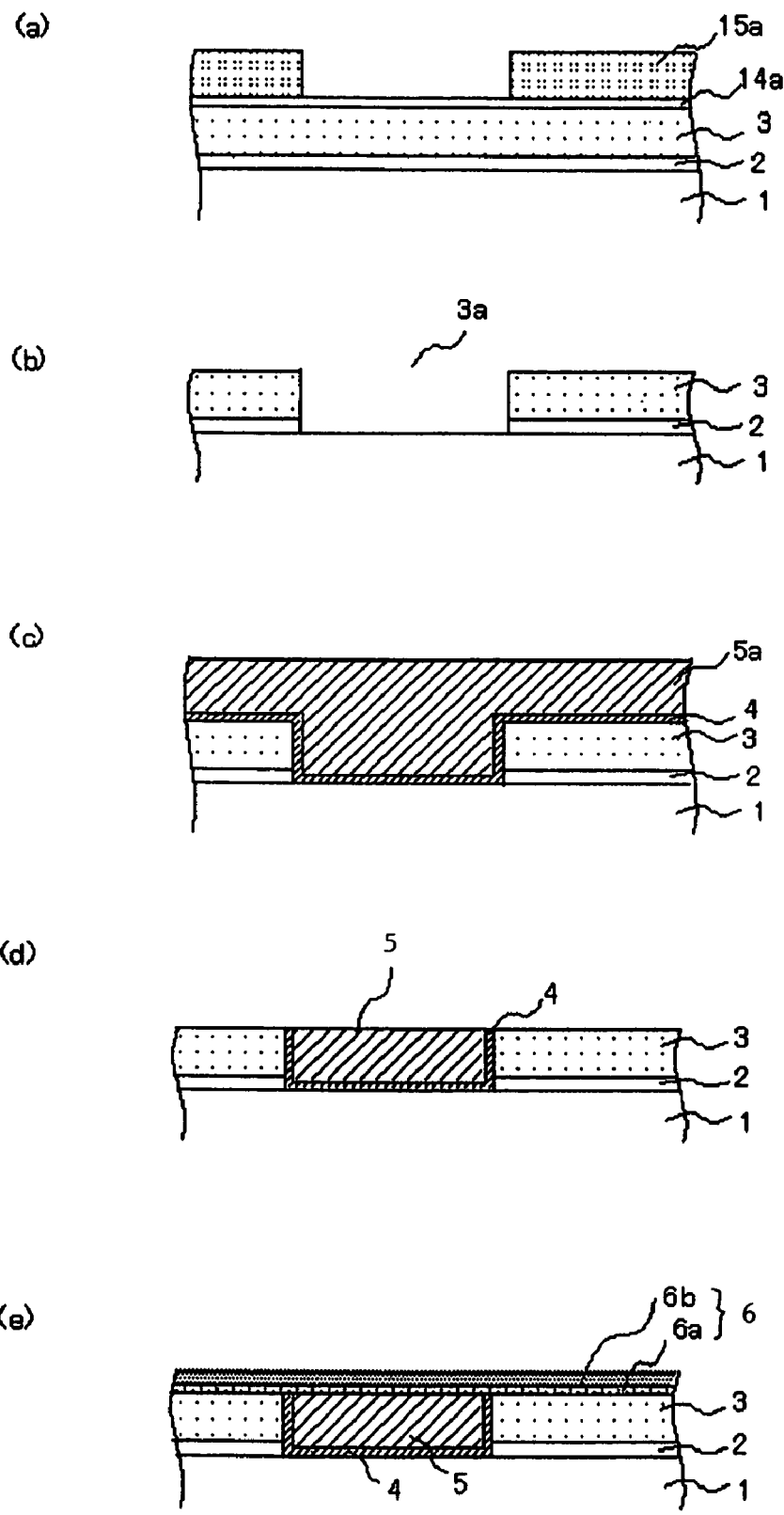
FIGS. 9(a)-(e) are a series of schematic cross-sectional views illustrating the steps of a manufacturing method (a dual damascene process) of a semiconductor device comprising a barrier film according to Second Example of the present invention.
Figure 10:
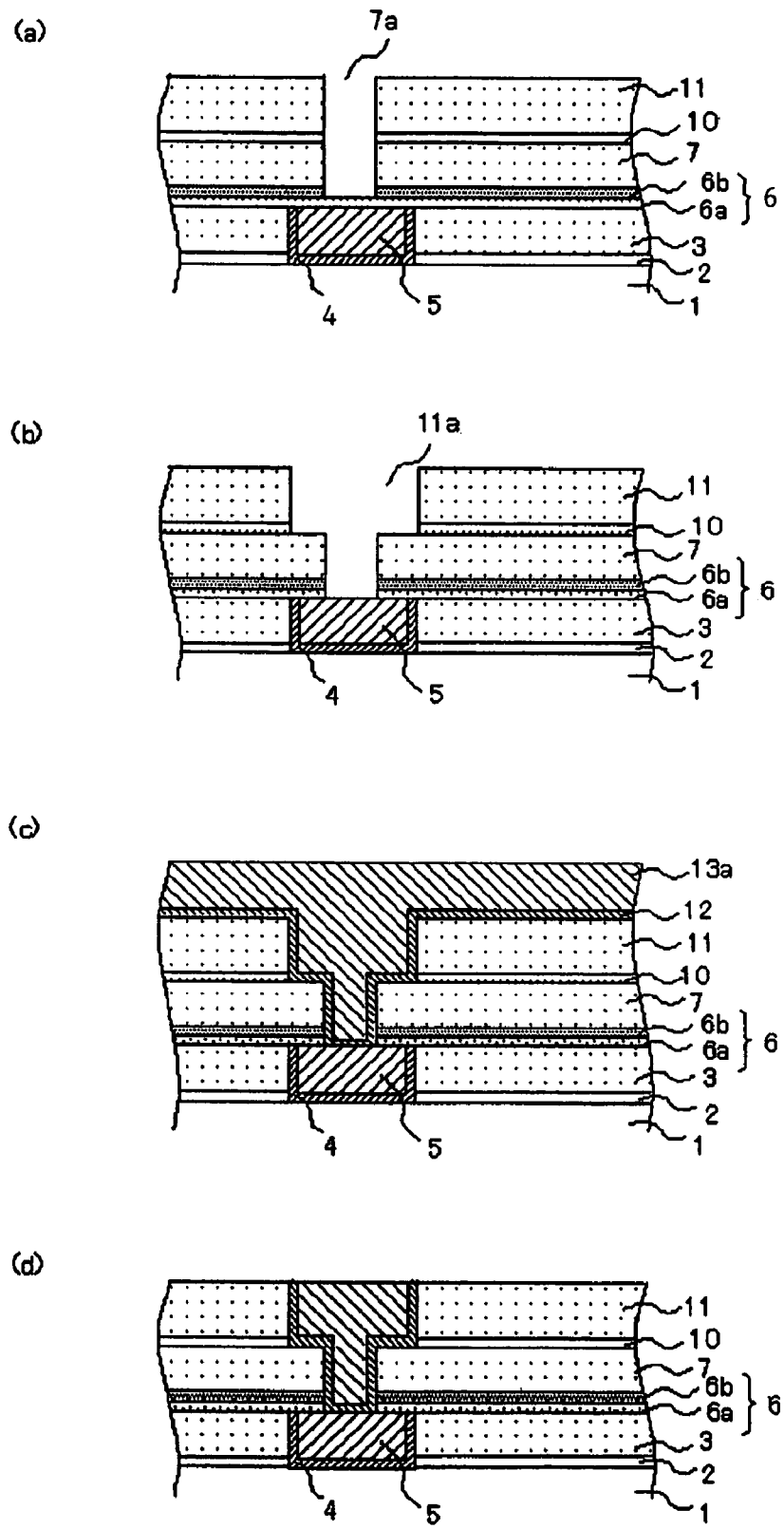
FIGS. 10(a)-(d) are a series of schematic cross-sectional views illustrating further steps of the manufacturing method (the dual damascene process) of a semiconductor device comprising a barrier film according to Second Example of the present invention.
Figure 11:
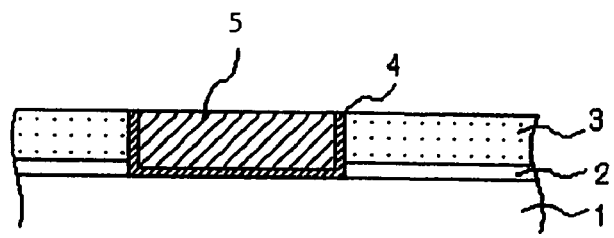
FIGS. 11(a)-(d) are a series of schematic cross-sectional views illustrating the steps of a conventional manufacturing method of a semiconductor device.
Figure 11:
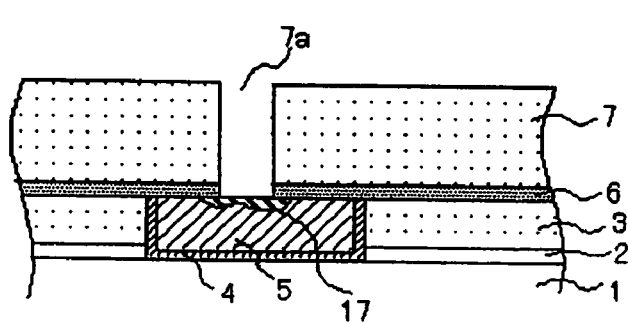
Figure 11:
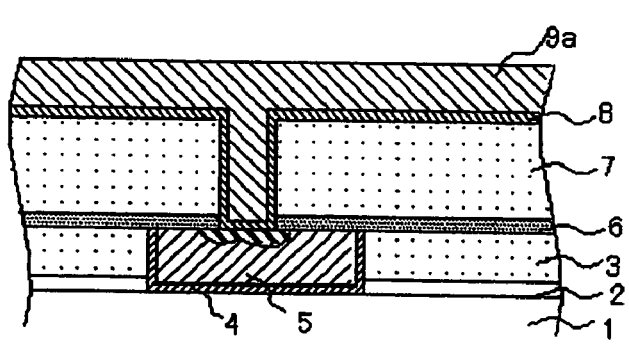
Figure 11:
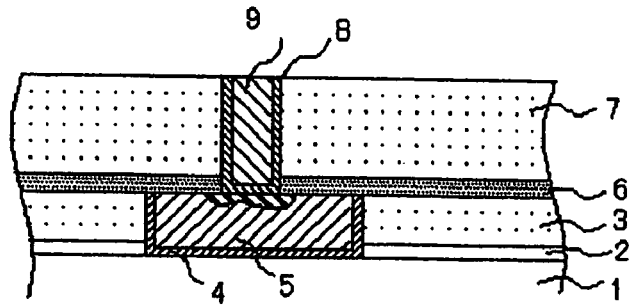
Figure 12:
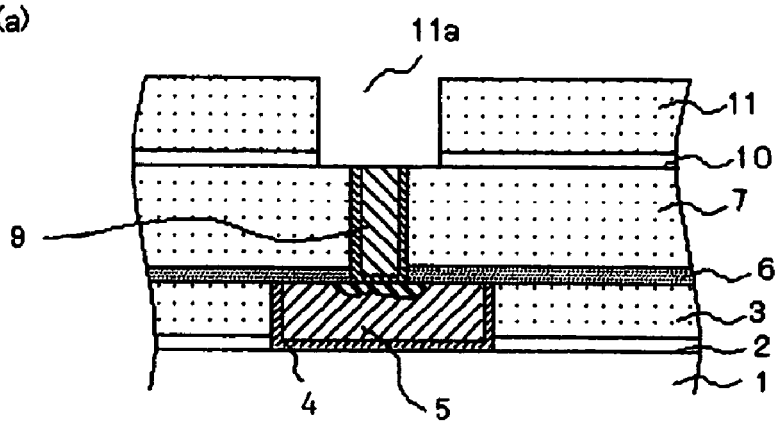
FIGS. 12(a)-(e) are a series of schematic cross-sectional views illustrating further steps of the conventional manufacturing method of a semiconductor device.
Figure 12:
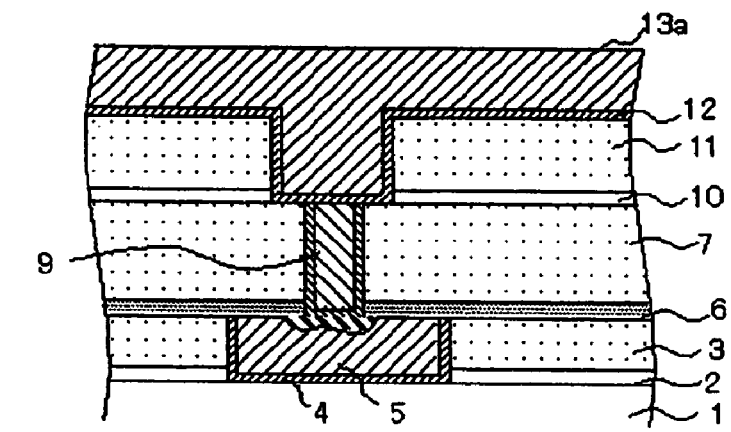
Figure 12:
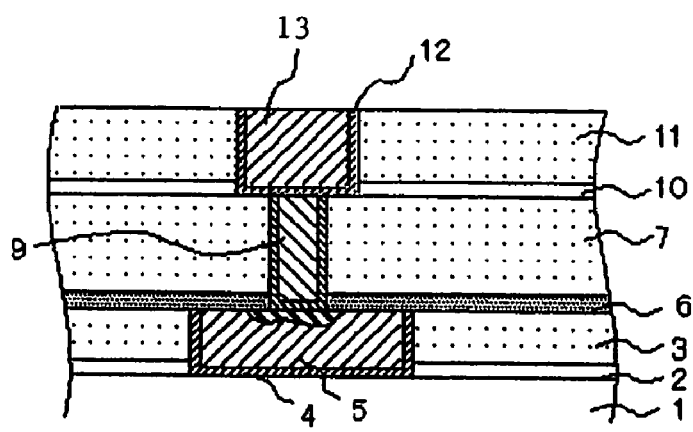

Next, referring to FIGS. 9 to 10, a semiconductor device according to Second Example of the present invention and a manufacturing method thereof are described. FIGS. 9 to 10 are schematic cross-sectional views illustrating, in sequence, the steps of a manufacturing method of a semiconductor device according to Second Example, and, for the convenience of the drawings, they are divided into two figures. In the present example, a barrier film with a layered structure of the present invention is applied to a via hole first dual damascene process, and, excepting that, the structure, the manufacturing method and the like of other parts are the same as First Example. The specific steps thereof are described below.

First, in the same way as First Example, on a substrate 1 in which elements such as MOS transistors are formed, a first barrier film 2 and a first interlayer insulating film 3 are formed in succession, and using, as a mask, a resist pattern 15a that is formed thereon, the first interlayer insulating film 3 is etched, and after the resist pattern 15a and the anti-reflection film 14a are removed by the oxygen plasma ashing, the first barrier film 2 is etched by means of etch back and thereby a first interconnection trench 3a is formed. Next, the deposition of a first barrier metal 4 is applied thereto to form a single-layered film of Ti, TiN, Ta, TaN, WN or the like or a layered film composed of two or more layers selected from a group of the foregoing films, and a seed metal of Cu (not shown in the drawings) is then formed thereon. After Cu 5a is formed by the electroplating method so as to fill up the inside of the first interconnection trench 3a with the Cu 5a, superfluous portions of the Cu 5a and the barrier metal 4 are removed by the CMP method, and thereby a lower layer interconnection 5 is formed in the first interlayer insulating film 3 (See FIGS. 9(a) to (d)).

Next, as shown in FIG. 9(e), using trimethylsilane, $NH_3$ and He as source gases, a second barrier film 6 made of a low-carbon-concentration film 6a and a high-carbon-concentration film 6b is formed by the plasma CVD method to a thickness of 20 to 80 nm or so under the same conditions of the gas flow rates, the gas pressures, the substrate temperature and the power as in First Example.

Next, as shown in FIG. 10(a), using trimethylsilane, $O_2$ and He as source gases, a second interlayer insulating film 10 made of SiOC is formed on the second barrier film 6 by the plasma CVD method to a thickness of 150 to 300 nm or so under the same conditions of the gas flow rates, the substrate temperature and the power as in First Example, and subsequently, a second interlayer insulating film 7, a third barrier film 10 and a third interlayer insulating film 11 are formed. After that, a resist pattern (not shown in the drawings) that is to be used for the formation of a via hole 7a is formed on the third interlayer insulating film 11, and using the low-carbon-concentration film 6a as an etching stopper, the anti-reflection film, the third interlayer insulating film 11, the third barrier film 10, the second interlayer insulating film 7 and the high-carbon-concentration film 6b are etched in succession by a known technique of dry etching.

Next, after the resist pattern and the anti-reflection film are removed by the oxygen plasma ashing, a resist pattern (not shown in the drawings) that is to be used for the formation of a second interconnection trench 11a is formed thereon, as shown in FIG. 10(b), and then using the third barrier film 10 as an etching stopper, the anti-reflection film, the third interlayer insulating film 11 are etched in succession by a known technique of dry etching. Following that, after the resist pattern and the anti-reflection film are removed by the oxygen plasma ashing, the low-carbon-concentration film 6a is etched by etch back, and thereby a second interconnection trench 11 joining with the via hole 7a to make them into one, is formed.

Next, as shown in FIG. 10(c), after films of a third barrier metal 12 such as Ti, TiN, Ta, TaN or WN and a seed metal of Cu (not shown in the drawing) are formed, a film of Cu 13a is formed by the electroplating method so as to fill up the insides of the via hole 7a and the second interconnection trench 11a with the Cu 13a, the superfluous portions of the Cu 13a and the third barrier metal 12 are removed by the CMP method, as shown in FIG. 10(d), and thereby an upper layer interconnection 13 connecting with the lower layer interconnection 5 is formed. After that, performing the above steps repeatedly, a prescribed multi-layered interconnection with a damascene structure may be formed.

In this method, too, the etching selection ratio of the second interlayer insulating film 7 to the low-carbon-concentration film 6a is satisfactorily large and, in addition, the resistance against the oxygen ashing is high. This enables dry etching for forming the via hole 7a to be stopped surely at the low-carbon-concentration film 6a and, in consequence, the exposure of the lower layer interconnection 5 can be prevented and the oxidation of the lower layer interconnection 5 in the step of ashing can be well suppressed. Further, since the low-carbon-concentration film 6a has a high capability to prevent the Cu diffusion as well as an excellent adhesiveness to the Cu interconnection, the EM resistance can be raised. Moreover, as the high-carbon-concentration film 6b laid as the upper layer has a low dielectric constant, the dielectric constant of the whole second barrier film 2 can be well reduced, and even when an interlayer insulating film with a low dielectric constant is utilized, the capacitance between the interconnections can be kept low.

Although the description in Second Example is made for a via hole first dual damascene process that is one form of the dual damascene process, the present invention can be similarly applied to a dual hard mask process in which an interconnection trench is formed by forming a hard mask on the second interlayer insulating film 7, or any other form of the dual damascene process. Further, in the respective aforementioned examples, the barrier film in the layered structure is described as a SiC-based or a SiCN-based barrier film whose main constituents are silicon, carbon and nitrogen, but the present invention is not limited to the afore-mentioned examples and can be applied to any barrier film utilizing a material whose etching selection ratio, adhesiveness to the Cu interconnection and dielectric constant can be changed through a change in carbon content therein.

As set forth above, a semiconductor device and its manufacturing method according to the present invention have the following effects.

The first effect of the present invention enables to overcome a problem that an interconnection or a via plug set in the underlying layer may be exposed by dry etching when a via hole or an interconnection trench is formed in the interlayer insulating film laid thereon, and its surface may be oxidized by the subsequent ashing, lowering the reliability of the via plug connection; a problem that the electromigration resistance may deteriorate because of poor adhesiveness between the interlayer insulating film and the interconnection and its insufficient preventive capability against the Cu diffusion; and a problem that the barrier film causes an increase in capacitance between the interconnections.

The reason lies in a fact that a SiC-based or a SiCN-based barrier film formed between the interconnection or the via plug and its overlying interlayer insulating film (especially the low-dielectric-constant insulating film) has a layered structure of a plurality of films with different carbon concentrations (preferably a double-layered structure composed of a lower layer that is a low-carbon-concentration film and an upper layer that is a high-carbon-concentration film) and thereby the etching selection ratio of the interlayer insulating film to the low-carbon-concentration film can be increased and its adhesiveness to the Cu interconnection or the via plug can be heightened and the Cu diffusion can be well prevented by the presence of the low carbon-concentration film, while the overall dielectric constant can be reduced by the presence of the high-carbon-concentration film.

Further, the second effect of the present invention allows forming the barrier film capable to provide above effects without making the steps of the manufacturing method unduly complicated.

The reason lies in a fact that a barrier film with a layered structure is not formed by using films with different constituent elements but formed of films with different characteristics but made from the identical constituent elements by simply changing carbon contents therein, which can be achieved through changes in pressure of the source gas within the same chamber so that there is no need to make the steps of fabricating a barrier film complicated.

What is claimed is:

1. A semiconductor device equipped with an interconnection or a via plug, being formed by a damascene structure; which comprises
   the structure in which a barrier film made of only two layered films, each of said two layered films containing silicon, carbon and nitrogen and having different carbon concentrations, is disposed between said interconnection or said via plug and its overlying layer that is an insulating interlayer,
   wherein said barrier film comprises, on the side of said interconnection or said via plug, a low-carbon-concentration film with a small carbon concentration and, on the side of said insulating interlayer, a high-carbon-concentration film with a carbon concentration larger than that of said low-carbon-concentration film and
   wherein when, the infrared absorption spectrum for said barrier film, infrared absorption areas of infrared absorption bands having a peak in the vicinity of 810 cm-1 and having a peak in the vicinity of 1250 cm 1 are denoted by I1 and I2, respectively,
   a value of I2/I1 for said low-carbon-concentration film in said barrier film is approximately 0.004 to 0.0067, and a value of I2/I1 for said high-carbon-concentration film in said barrier film is approximately 0.0067 to 0.014.

2. A semiconductor device according to claim 1, wherein said insulating interlayer formed on said barrier film is made of an insulating film whose main constituent elements are silicon, carbon and oxygen.

3. A semiconductor device equipped with an interconnection or a via plug, being formed by a damascene structure; which comprises
   a structure in which a barrier film made of only two layered films, each of said two layered films containing silicon, carbon and nitrogen and having different carbon concentrations, is disposed between said interconnection or said via plug and its overlying layer that is an insulating interlayer,
   wherein said barrier film comprises, on the side of said insulating interlayer, a low-carbon-concentration film with a small carbon concentration and, on the side of said interconnection or said via plug, a high-carbon-concentration film with a carbon concentration larger than that of said low-carbon-concentration film and
   wherein when, the infrared absorption spectrum for said barrier film, infrared absorption areas of infrared absorption bands having a peak in the vicinity of 810 cm-1 and having a peak in the vicinity of 1250 cm 1 are denoted by I1 and I2, respectively,
   a value of I2/I1 for said low-carbon-concentration film in said barrier film is approximately 0.004 to 0.0067, and a value of I2/I1 for said high-carbon-concentration film in said barrier film is approximately 0.0067 to 0.014.

4. A semiconductor device according to claim 3, wherein said insulating interlayer formed on said barrier film is made of an insulating film whose main constituent elements are silicon, carbon and oxygen.

* * * * *

UNITED STATES PATENT AND TRADEMARK OFFICE
CERTIFICATE OF CORRECTION

| | | |
|---|---|---|
| PATENT NO. | : 7,391,115 B2 | Page 1 of 1 |
| APPLICATION NO. | : 10/768676 | |
| DATED | : June 24, 2008 | |
| INVENTOR(S) | : Tatsuya Usami et al. | |

It is certified that error appears in the above-identified patent and that said Letters Patent is hereby corrected as shown below:

Col. 16, line 38 (claim 3); Delete "a structure" and insert --the structure--

Signed and Sealed this

Seventeenth Day of February, 2009

JOHN DOLL
*Acting Director of the United States Patent and Trademark Office*